United States Patent [19]
Walker

[11] Patent Number: 5,227,326
[45] Date of Patent: Jul. 13, 1993

[54] METHOD FOR FABRICATING NON-VOLATILE MEMORY CELLS, ARRAYS OF NON-VOLATILE MEMORY CELLS

[75] Inventor: Kevin L. Walker, Houston, Tex.

[73] Assignee: Texas Instruments Incorporated, Dallas, Tex.

[21] Appl. No.: 894,171

[22] Filed: Jun. 3, 1992

Related U.S. Application Data

[63] Continuation of Ser. No. 816,428, Dec. 23, 1991, abandoned.

[51] Int. Cl.$^5$ ............................................. H01L 21/70
[52] U.S. Cl. ........................................ 437/52; 437/43; 437/48
[58] Field of Search ................. 437/43, 48, 52, 228, 437/233, 235; 257/314, 315, 390, 391

[56] References Cited

U.S. PATENT DOCUMENTS

| | | | |
|---|---|---|---|
| 4,358,889 | 11/1982 | Dickman et al. | 437/45 |
| 5,057,448 | 10/1991 | Kuroda | 437/43 |

FOREIGN PATENT DOCUMENTS

238661 9/1990 Japan.

Primary Examiner—Tom Thomas
Attorney, Agent, or Firm—W. James Brady, III; B. Peter Barndt; Richard L. Donaldson

[57] ABSTRACT

The method is provided for selectively fabricating erasable read-only memory and read-only memory cells at a face of a layer of semiconductor of a first conductivity type. Active areas on the face of the layer of semiconductor are selectively defined by masking the face of the layer of semiconductor and patterning and etching the mask to expose first and second areas of the layer of semiconductor. A layer of conductor is formed insulatively adjacent the active area of each cell being fabricated. The layer of conductor is patterned and etched to define a first level gate conductor adjacent at least a portion of the active area of each cell being fabricated, the first level gate of each read-only memory cell set to a logic zero being fabricated disposed adjacent a one of the insulator regions adjacent a corresponding one of the third exposed areas. A layer of interlevel insulator is formed adjacent the first level gate of each erasable read-only memory cell being fabricated. A second layer of conductor is formed adjacent the layer of interlevel insulator of each erasable memory cell being fabricated. The second layer of conductor, the layer of interlevel insulator, and the first level gate of each erasable read-only memory cell is etched to define a floating gate/control gate stack. Source/drain regions of a second conductivity type opposite the first conductivity type are formed into portions of the active areas of each memory cell being fabricated exposed during the steps of etching.

22 Claims, 4 Drawing Sheets

METHOD FOR FABRICATING NON-VOLATILE MEMORY CELLS, ARRAYS OF NON-VOLATILE MEMORY CELLS

This application is a continuation of application Ser. No. 07/816,428, filed Dec. 23, 1991 now abandoned.

NOTICE

Copyright, *M* Texas Instruments Incorporated, 1990. A portion of the Disclosure of this patent document contains material which is subject to copyright protection. The copyright and mask work owner has no objection to facsimile reproduction by anyone of the patent document or the patent disclosure, as it appears in the U. S. Patent and Trademark Office, patent file or records, but otherwise reserves all rights in its copyright and mask work whatsoever.

TECHNICAL FIELD OF THE INVENTION

The present invention relates in general to semiconductor devices and in particular to non-volatile memory cells, arrays of non-volatile memory cells, and methods of fabricating the same.

BACKGROUND OF THE INVENTION

Many types of integrated circuit products, such as microcontrollers, are customized by the provision of a customized operating instruction set contained in an on-chip read-only memory (ROM) array. The customized instruction set may be developed by the chip maker or the customer and then permanently "programmed" in to the ROM during the chip fabrication process. The ROM may be an array of addressable cells with an operable transistor fabricated at those cells in the array designated to read as a logic "one" when addressed and with no transistor or an inoperable transistor fabricated at those cells designated to read as a logic "zero" when addressed. For example, in the case of a cell designated as a logic "one", a field effect transistor may be fabricated such that when the cell is addressed by applying voltages to the source, drain and gate, current will flow through the channel which can be sensed as a logic "one". Conversely, for the case of a cell designated as a logic "zero", an inoperable field effect transistor may be fabricated such that when the source, drain and gate voltages are applied during addressing, no current will flow thereby indicating a logic "zero". The inoperable field effect transistor may be created by fabricating a gate oxide layer which is sufficiently thick that a channel cannot be created between the source and the drain when a normal reading voltage is applied to the gate. The inoperable transistor may also be created by fabricating cells in which one of the source or drain diffusions is missing or in which the source and drain diffusions are so widely spaced as to prevent channel sufficiently wide formation therebetween.

While a ROM array is very useful for a customized final product, because it is permanently "programmed" during manufacture, it is not well suited for development products. Simply put, when a change in the instruction set is required during development, an entirely different ROM array may be required on-chip. A new ROM array in turn will require the refabrication of at least part of the chip to "reprogram" the memory ,cells. This problem is solved by the use of an erasable read-only memory (EPROM) array which can be programmed and erased during chip development. EPROM cells store a bit of information as a quantity of electrons on a floating gate structure insulatively formed between the channel area and the control gate of the field effect transistor. A charged floating gate raises the threshold voltage of the field effect transistor channel above the voltage normally applied to the control gate during the read operation, thereby storing a logic "zero." An uncharged floating gate does not alter the threshold voltage of the channel of the field effect transistor, and therefore a normal gate reading voltage will exceed the threshold voltage thereby storing a logic "one." As known in the art, these EPROM cells are commonly programmed by charging the floating gate through hot electron injection and erased by exposure to ultraviolet light. Due to the increased complexity of the EPROM cell (which not only requires the additional floating gate and the associated interlevel insulators but also an erasing window and its associated structures), the EPROM has serious disadvantages when used as part of the final version of the customized product. This is especially true when it is recognized that once the final product design is ready, the need for an erasable array is essentially eliminated.

Thus, in many cases a development chip using an EPROM device must be designed and fabricated and once the final implementation is arrived at, a final production version must be designed and fabricated using a ROM array. This process, aside from any changes to the logic and power circuitry on the chip, almost requires the design and fabrication two versions of the same overall product. In most cases, an inefficient duplication of design and fabrication efforts results.

Thus, a need has arisen for devices and methods for reducing the amount of duplicative efforts required to provide the customer with both development and production versions of a customized integrated circuit.

SUMMARY OF THE INVENTION

A method is provided for selectively fabricating erasable read-only memory and read-only memory cells at a face of a layer of semiconductor of a first conductivity type. Active areas on the face of the layer of semiconductor are selectively defined by masking the face of the layer of semiconductor and patterning and etching the mask to expose first and second areas of the layer of semiconductor. The first and second areas are spaced to define the active area therebetween for each cell being fabricated. A third area within the active area is additionally exposed for each read-only memory cell set to a logic zero being fabricated. Insulator regions are formed adjacent to the exposed area. A layer of conductor is formed insulatively adjacent the active area of each cell being fabricated. The layer of conductor is patterned and etched to define a first level gate conductor adjacent at least a portion of the active area of each cell being fabricated, the first level gate of each read-only memory cell set to a logic zero being fabricated adjacent one of the insulator regions formed by a corresponding one of the third exposed areas. A layer of interlevel insulator is formed adjacent the first level gate of each erasable read-only memory cell being fabricated. A second layer of conductor is formed adjacent the layer of interlevel insulator of each erasable memory cell being fabricated. The second layer of conductor, the layer of interlevel insulator, and the first level gate of each erasable read-only memory cell is etched to define a floating gate/control gate stack. Source/drain regions of a second conductivity type opposite the first conductivity type are formed into portions of the active areas of each memory cell being fabricated and exposed during the steps of etching.

The inventive concepts embodied in the present invention allow for the selective manufacture of either an EPROM cell, a ROM cell set to a logic one, or a ROM cell set to a logic zero by the expeditious steps of changing the masking layers. Further, due to the commonality in the fabrication process of both EPROM and ROM cells according to the preferred embodiments of the present invention, the fabrication steps required for the additional structures necessary for an EPROM cell can simply be skipped. The commonality of the fabrication processes of the ROM and EPROM cells according to the preferred embodiments of the present invention allows for the fabrication of an array of EPROM cells for development devices and when a production device is desired, an array of ROM cells can be fabricated by simply changing masks and skipping a small number of intermediate steps. In this manner, completely different cell designs are not required for the development and production versions of a selected programmed integrated circuit device.

BRIEF DESCRIPTION OF THE DRAWINGS

For a more complete understanding of the illustrated embodiments of the present invention, and the advantages thereof, reference is now made to the following descriptions, taken in conjunction with the following drawings, in which.

DETAILED DESCRIPTION OF THE INVENTION

Preferred embodiments of the processes, devices, and systems described herein and their advantages are best understood by referring to FIGS. 1-10 of the drawings, like numerals being used for like and corresponding parts within the various drawings The preferred embodiments of the present invention will be illustrated by describing in parallel the corresponding fabrication steps for an electrically programmable read-only memory (EPROM) cell 10, a read- only memory (ROM) cell 12 set (fabricated) to read as logic "1" and a read-only memory (ROM) cell 14 set (fabricated) to read as a logic "0". In the preferred embodiment, a selected memory cell (or array of memory cells) on an integrated circuit chip can be selectively fabricated as either an EPROM cell 10, a ROM cell 12 or a ROM cell 14 by selection of the fabrication masks, as discussed in detail below.

Figure 1:
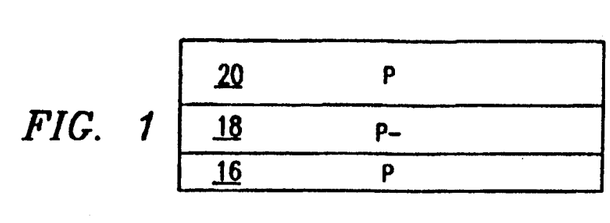
FIGS. 1, 2a-2c, 3a-3c, 4a-4c, 5a-5c, 6a-6c, 7a-7c, and 8a-8c are a series of greatly enlarged schematic elevational sectional views of a semiconductor workpiece showing progressive stages in the selective fabrication of erasable read-only memory and read-only memory cells according to the preferred embodiment.

Referring first to FIG. 1, the initial fabrication steps include the definition and preparation of the "tanks" of semiconductor in which either an EPROM cell 10, a ROM cell 12 or a ROM cell 14 is to be fabricated. In each case, the fabrication process begins with a substrate 16 which is preferably a p-type silicon substrate which may, for example, have a resistivity of about 0.015 and a [100] crystallography. A p-epitaxial layer 18 is grown across the surface of the silicon substrate 16. Next, the tanks in which the various electronic devices on the integrated circuit chip are to be formed are defined For the overall fabrication of an integrated circuit such as a microcontroller, these tanks may be formed of both p and n conductivity types, and will be used in the fabrication of a number of "off-array" devices, such as logic and power devices, in addition to the EPROM and ROM cells which are the subject of the present invention. For purposes of illustrating the present invention, a tank 20 of p-type material is formed into epitaxial layer 18. Tank 20 may be formed using a conventional implant of boron followed by a thermal drive step. The dopant concentration and depth of tank 20 are chosen as a function of the voltages and currents to be applied thereto, as is known in the art.

Figure 2A:
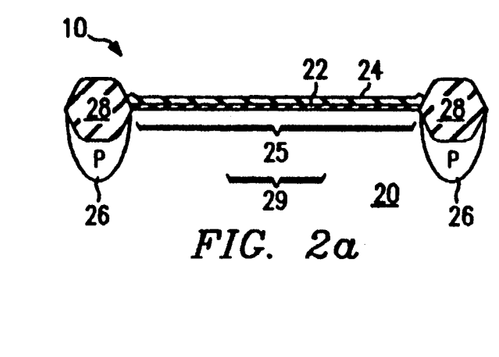
Figure 2B:
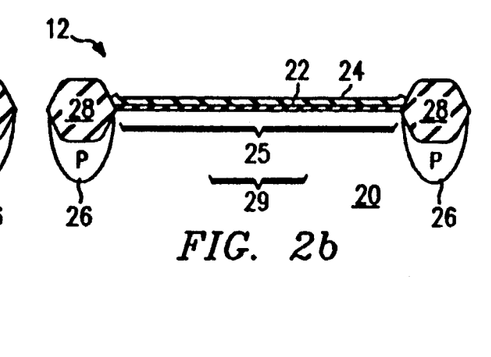
Figure 2C:
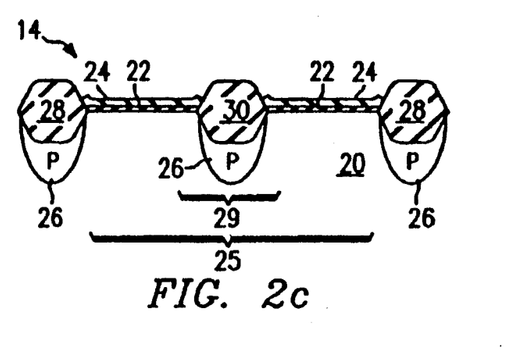

In FIGS. 2a-2c, the definition of the active and isolation areas (the "moats") is depicted for EPROM cell 10 and ROM cells 12 and 14, respectively. A hard mask consisting of a layer 22 of oxide and layer 24 of nitride are formed across the surface of p-tank 20. Nitride layer 24 is then patterned and etched to expose areas of tank 20 over which isolation areas of field oxides are to be formed. The unetched portion of the mask 22/24 covers the "active" areas 25 of tank 20. A channel stop implant 26 may next be performed by implantation of a p-type dopant (preferably boron) into the exposed areas. Thick field oxide regions 28 are then grown over channel stop implants 26.

In FIGS. 2a and 2b, depicting the fabrication of EPROM cell 10 and ROM cell 12, the thermally grown oxides 28 define the lateral boundaries of the "active areas" 25 of the cells, which subsequently will include the source and drain diffusions, and the channel area 29 of each cell. In the case of the ROM cell 14 set to a logic "0", as shown in FIG. 2c, a field oxide region 30 is additionally grown in the channel area 29 of the cell. For the case of ROM cell 14, the transistor gate will subsequently be formed over thermally grown oxide region 30 such that when a voltage is applied to the gate of cell 14, no channel will be formed in the channel area 29 of the cell thereby preventing source to drain current flow when reading voltages are applied, indicating a logic "0". The additional oxide region 30 is formed advantageously by changing the patterning and etching o the hard mask to expose additional surface area of tank 20.

Next, the hard mask consisting of oxide layer 22 and nitride layer 24 is removed from the face of the workpiece. Next, a threshold voltage adjust implant may be performed into the now exposed active areas of p-tank 20. For the n-channel devices of the illustrated embodiment, a p-type dopant (typically boron) may be implanted into the active areas of p-tank 20 to raise the threshold voltage. This process may also be done simultaneously for off-array devices under fabrication (for p-channel devices an implant of n-type dopant such as arsenic or phosphorous may be performed to raise the threshold voltage).

Figure 3A:
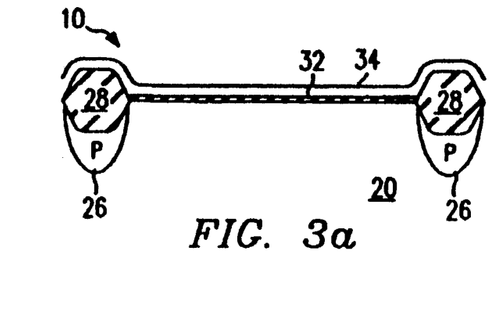
Figure 3B:
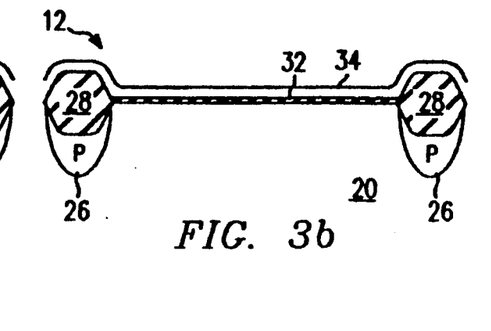
Figure 3C:
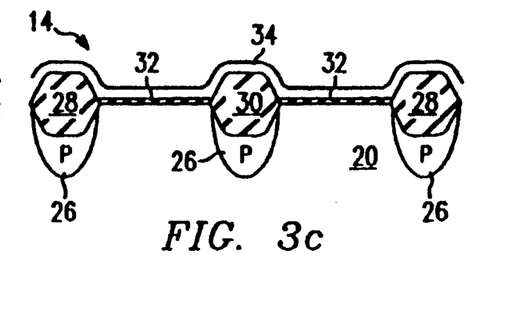

Following the definition of the active and isolation areas and the threshold adjust implants, a layer of gate oxide 32 is grown on the exposed areas of p-tank 20 as shown in FIGS. 3a, 3b and 3c for either an EPROM cell 10, a ROM cell 12, or a ROM cell 14. Further, in all cases, after the gate oxide growth, a layer 34 of first level polycrystalline silicon (first level "polysilicon" or "poly 1") is deposited across the face of the workpiece and rendered conductive by implantation or chemical doping.

Figure 4A:
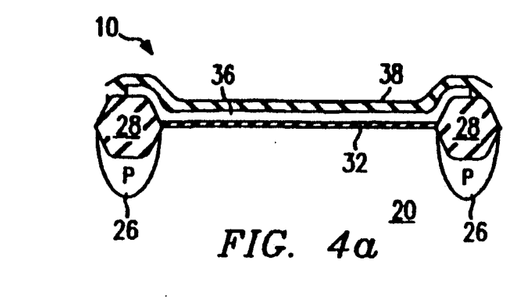
Figure 4B:
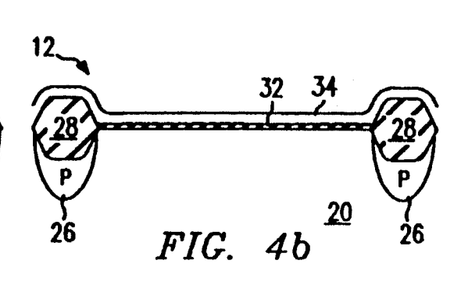
Figure 4C:
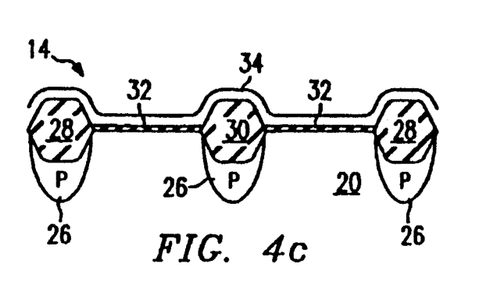

Referring next to FIG. 4, when an EPROM cell 10 is desired, first level polysilicon layer 34 is patterned and etched to define a floating gate 36, as required in a conventional EPROM cell. Next, for an EPROM cell 10 or an array of EPROM cells 10, a layer 38 of interlevel insulator is deposited across the face of the workpiece. Interlevel insulator layer 38 may be a layer of oxide, a layer of oxide/nitride or a layer of oxide/nitride/oxide. For the fabrication of a ROM cell 12 or a ROM cell 14, the steps of defining a floating gate and depositing the interlevel insulator are not performed.

Figure 5A:
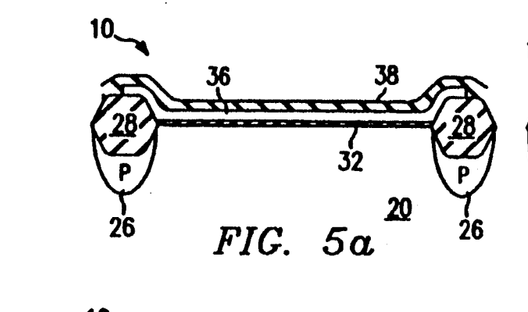
Figure 5B:
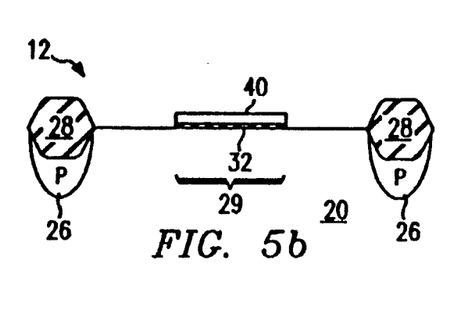
Figure 5C:
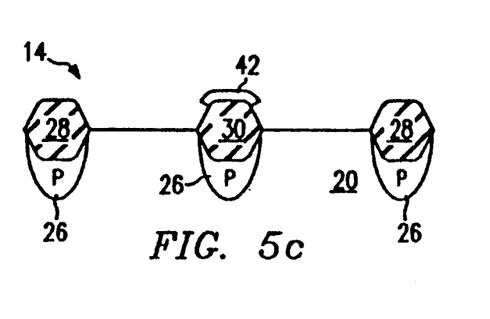

Referring next to FIGS. 5a–5c, the fabrication of the transistor gates for ROM cells 12 and 14, when selected for fabrication, are defined. As shown in FIG. 5b, for a ROM cell 12 set to a logic "1", polysilicon layer 34 and gate oxide layer 32 are patterned and etched to define a transistor gate 4 spaced from the channel area of tank 20 by the remaining portion of gate oxide layer 32. As shown in FIG. 5c, for a ROM cell 14 set to a logic "0", first level polysilicon layer 34 and gate oxide layer 32 are patterned and etched to define a transistor gate 40 spaced from the channel area of tank 20 by thick isolating oxide region 30. For both the ROM cells 12 and 14, polysilicon layer 34 may be simultaneously etched outside of the memory cell array to define the gate structures of off-array devices, such as field effect transistors for the accompanying logic circuitry (not shown). Also at this step, in the case of an EPROM cell 10, the interlevel oxide layer 38, polysilicon layer 34 and gate oxide layer 32 outside the memory array may be patterned and etched to define gate structures for the accompanying off-array devices (not shown).

Figure 6A:
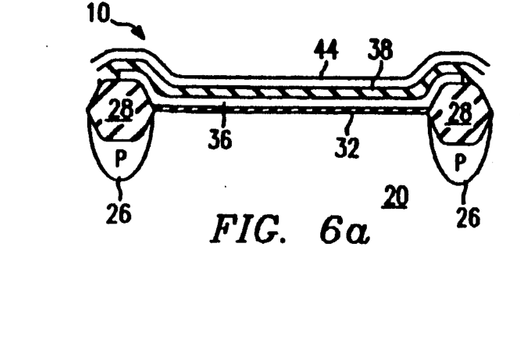
Figure 6B:
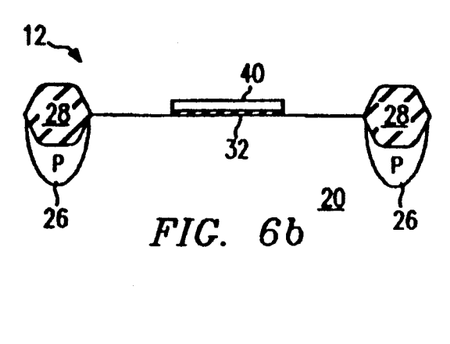
Figure 6C:
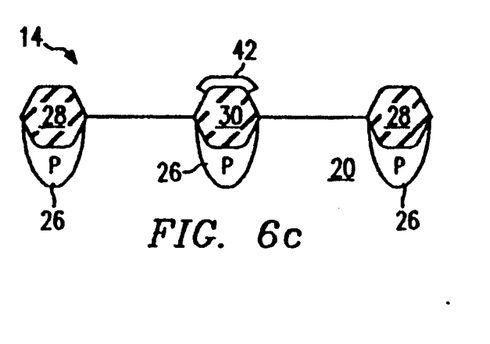

When an EPROM cell 10 is desired, a layer 44 of second level polycrystalline silicon ("second polysilicon" or "poly 2") is deposited across the face of the workpiece, as shown in FIG. 6a. Prior to this step, high voltage gate oxide may be grown for any accompanying high voltage transistors being fabricated outside the memory array (not shown). Subsequent to deposition, "poly 2" layer 44 may be patterned and etched to define additional gate structures for off-array devices (not shown). If a ROM cell 12 or a ROM cell 14 is desired, the steps of depositing and doping a second layer of polycrystalline silicon are not required and are therefore skipped.

Figure 7A:
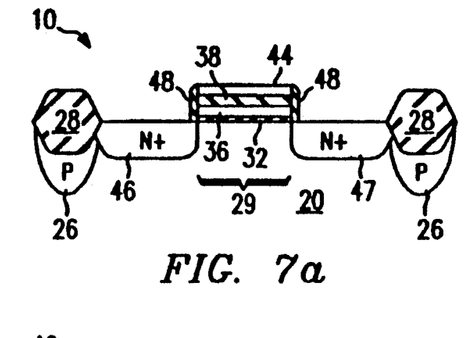
Figure 7B:
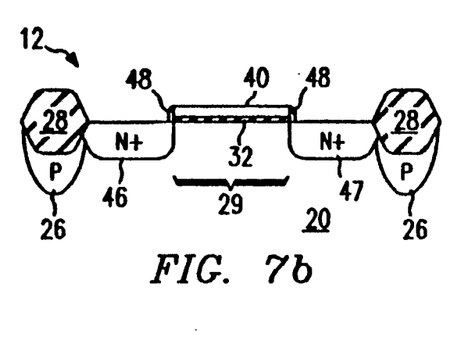
Figure 7C:
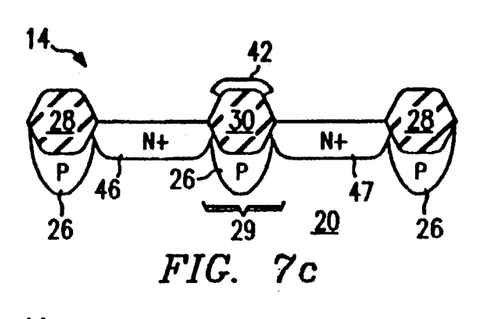

As shown in FIG. 7a, a stack etch of second level polysilicon 44, interlevel insulator 38, first level polysilicon layer 36 and gate oxide layer 32 is performed to define a conventional EPROM stack overlying the channel area of substrate 20. The EPROM stack includes the floating gate 36 and a control gate 44. Next, as shown in FIG. 7a–7c, for all cases heavily doped implants 46 and 47 are formed in the exposed areas of tank 20 to provide the transistor n+ source/drain regions. Source/drain regions 46 and 47 may be formed, for example, by an implant of arsenic or phosphorous. Following formation of source/drain regions 46 and 47, sidewall oxides 48 may be formed by a conventional deposition and etching process along the edges of the gate/insulator stacks of EPROM cell 10 and ROM cell 12.

Figure 8A:
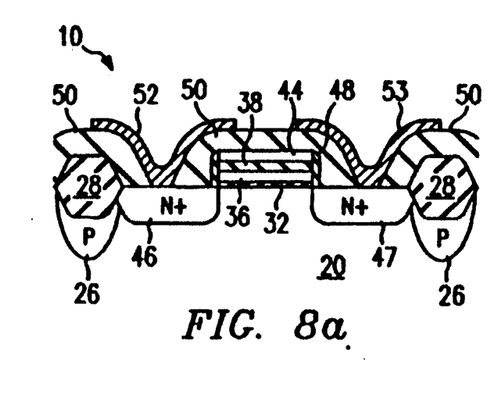
Figure 8B:
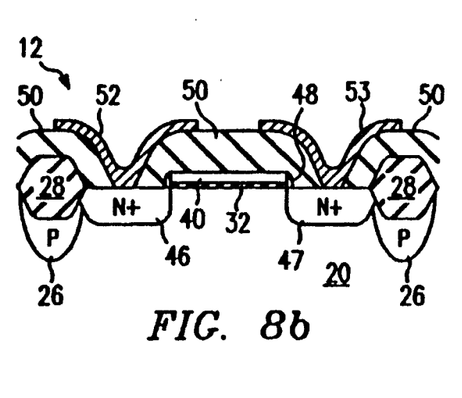
Figure 8C:
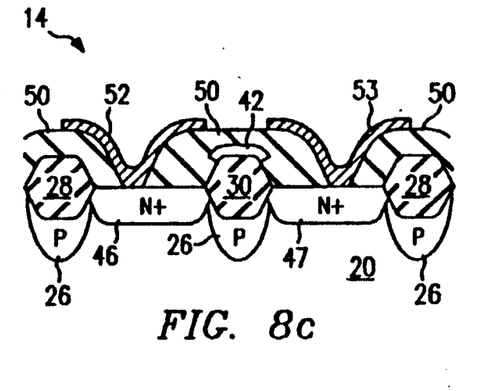

As depicted in FIGS. 8a–8c, for either a EPROM cell 10, a ROM cell 12 or a ROM cell 14, a layer 50 of doped glass, which may be phosphosilicate glass or borophosphosilicate glass, is deposited across the face of the workpiece. Doped glass layer 50 is then patterned and etched to define contact holes to the underlying source/drain regions 46 and 47. Next, a first layer 52/53 of metal is deposited, patterned, and etched to form the desired electrical connections 52 and 53 to the source/drain regions 46/47. Further levels of metal (not shown) may be subsequently deposited (along with additional layers interlevel insulator), patterned and etched to provide further interconnections.

Figure 9:
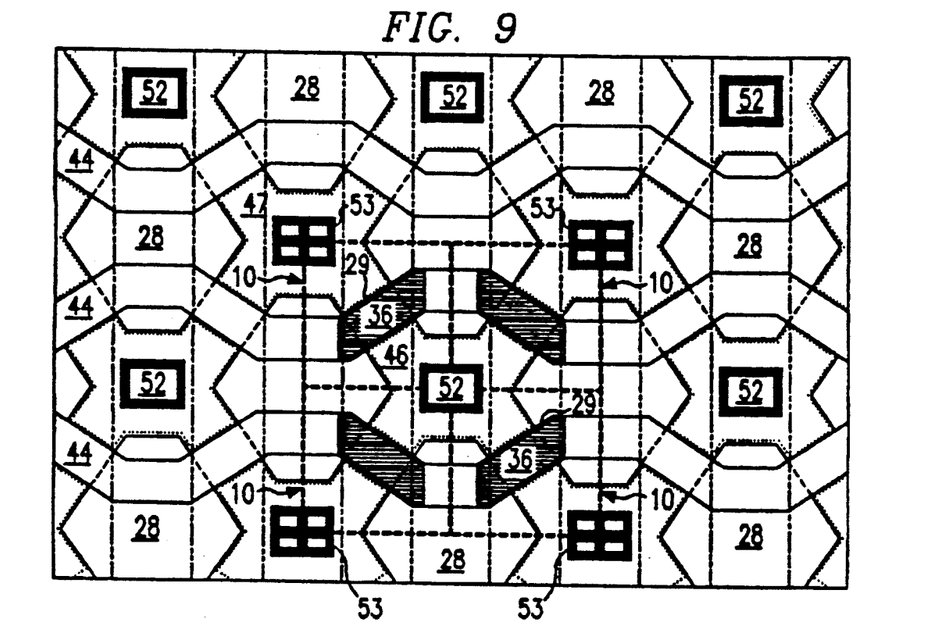
FIG. 9 is a plan view small section of an array of erasable memory cells fabricated according to the preferred embodiment.

Referring next to FIG. 9, a small portion of an array of EPROM cells 10 arranged in an "x" cell configuration is depicted. In the "x" cell array, source/drain regions 46 and 47 are formed common to groups of four cells 10, as are corresponding metal connections 52 and 53. A group of four typical EPROM cells 10 are shown generally by dashed lines in FIG. 9. Insulator regions 28 are fabricated as "islands" in order to space x-shaped active areas, including x-shaped source/drain regions 46 and 47 spaced apart by a channel area 29. Each channel area 29 formed between neighboring source/drain regions 46 and 47 includes a floating gate 36. The control gate conductors 44 are formed as elongated word lines extending along each row thereby overlying each floating gate conductor 36 for the cells along that row.

In an application such as a microcontroller, the EPROM array shown in FIG. 9 would typically be used for a development chip where the ability to erase the cell during firmware development is a critical factor. As previously discussed, the EPROM cell and its additional structures, such as floating gate 36, may not be needed or desired for the memory array of a production chip. A ROM cell, such as ROM cell 12 or 14, with its reduced structural requirements would be more applicable to the production parts normally produced in number after the firmware has been developed. In the depicted EPROM array configuration, an EPROM cell 10 could be turned into a ROM cell 14 (set to a logic "0") by simply breaking a connection through one of the metal connections 52 or 53. This has a significant disadvantage when common metal connections 52/53 and/or common source/drain 46/47 regions are used, since four cells are rendered nonconductive (i.e. will read a logic "0") for each broken metal connection 52 or 53. To provide a ROM cell 12 set to a logic "1", the floating gate 36 of the selected cell would simply not be charged with electrons, the floating gate 36 itself therefore not actually required. The inventive concepts embodied in the preferred embodiments of the present invention, in which changes to the masking layers are used to expeditiously change an EPROM cell 10 into a ROM cell 12 or 14, are therefore particularly advantageous in the x-cell array configuration.

Figure 10:
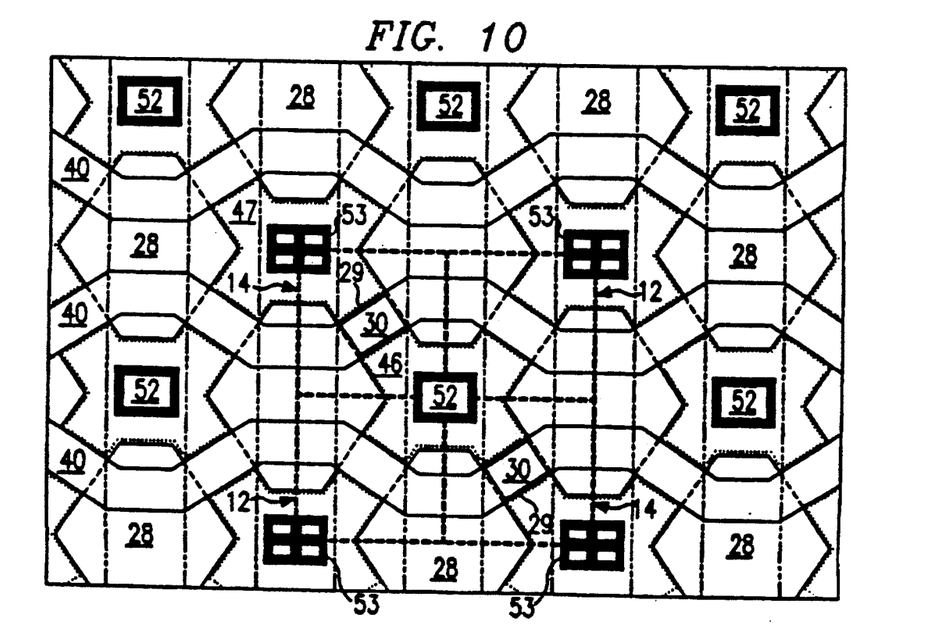
FIG. 10 is a plan view of a small section of an array of read-only memory cells fabricated according to the preferred embodiment.

Referring to FIG. 10, a portion of an array of ROM cells 12 and 14 are formed from the same "x" cell active area/isolation area structure shown in FIG. 9 for an array of EPROM cells 10. As previously discussed, to form a ROM cell 14, a single change to the "moat mask" defining the isolation oxide regions 28 (and active areas 25) results in an oxide region 30 being formed which prevents the gate 42 of ROM cell 14 from inducing a channel in the underlying channel area of the tank 20. Further the respective gates 40 and 42 of ROM cells 12 and 14 can be defined using the same first level polysilicon layer deposition, doping and etching technique used to form the floating gate 36 of EPROM cell 10, the only difference being in the actual masking of poly layer 36 (in the array configuration forming elongated wordlines 40 (see FIG. 10) rather than discrete floating gates. For Rom cells the gate 40 is the same piece of poly as the wordline 40.

Although the present invention and its advantages have been described in detail, it should be understood that various changes, substitutions and alterations can be made herein without departing from the spirit and scope of the invention as defined by the appended claims.

What is claimed is:

1. A method for selectively fabricating erasable read only memory and read only memory cells at a face of a layer of semiconductor of a first conductivity type comprising the steps of:

selectively defining active areas on the face of the layer of semiconductor comprising the substeps of:
   masking the face of the layer of semiconductor;
   patterning and etching the mask to expose first and second areas of the layer of semiconductor that are spaced to define an active area therebetween for each cell being fabricated, a third area within the active area additionally exposed for each read only memory cell set to a logic zero being fabricated; and
   forming insulator regions adjacent the exposed areas;
   forming a layer of conductor insulatively adjacent the active area of each cell being fabricated;
   patterning and etching the layer of conductor to define a first level gate conductor adjacent at least a potion of the active area of each memory cell being fabricated, the first level gate conductor of each read only memory cell set to a logic zero being fabricated adjacent one of the insulator regions adjacent a corresponding one of the third exposed areas;
   forming a layer of interlevel insulator adjacent the first level gate conductor of each erasable read only memory cell being fabricated;
   forming a second layer of conductor adjacent the layer of interlevel insulator of each erasable read only memory cell being fabricated;
   etching the second layer of conductor, the layer of interlevel insulator and the first level gate conductor of each erasable read only memory cell being fabricated to define a floating gate/control gate stack; and
   forming source/drain regions of a second conductivity type opposite the first conductivity type in portions of the active area of each memory cell being fabricated.

2. The method of claim 1 wherein said step of forming a layer of conductor comprises the steps of depositing a layer of polycrystalline silicon and rendering the layer of polycrystalline silicon conductive.

3. The method of claim 1 wherein said step of forming insulator regions adjacent the exposed areas of the face of the layer of semiconductor comprises the step of growing thermal oxide.

4. The method of claim 3 wherein said step of growing thermal oxide includes the substep of performing an implant of dopants of the first conductivity type into the exposed areas.

5. The method of claim 1 wherein said step of forming a second layer of conductor comprises the step of forming a layer of polycrystalline silicon and rendering the layer of polycrystalline silicon conductive.

6. The method of claim 1 and further comprising the steps of:

forming a second layer of interlevel insulator across the face of each cell being fabricated;
   patterning and etching the second layer of insulator to open contact holes to the source/drain regions of each cell being fabricated; and
   forming connections to the source/drain regions of each cell being fabricated through the contact holes in the second layer of interlevel insulator.

7. A method for selectively fabricating erasable read only memory and read only memory cells at a face of a layer of semiconductor of a first conductivity type comprising the steps of:

selectively defining active areas on the face of the layer of semiconductor comprising the substeps of:
   masking the face of the layer of semiconductor;
   for each group of four memory cells being fabricated, patterning and etching the mask of expose areas of the layer of semiconductor to define an X-shaped active area therebetween, the active area including a common first source/drain area for the four cells and four arms, each arm including channel area and a second source/drain area for each cell being fabricated, at least a portion of the channel area additionally exposed for each read only memory cell set to a logic zero being fabricated; and
   forming insulator regions adjacent the exposed areas;
   forming a layer of conductor insulatively adjacent at least the active areas;
   patterning and etching the layer of conductor to define a first level transistor gate conductor adjacent the channel area of each read only memory cell being fabricated, the first level gate conductor of each read only memory cell set to a logic zero disposed adjacent the insulator region formed adjacent the exposed area in the corresponding channel area;
   forming a layer of interlevel insulator adjacent the first level gate conductor of each erasable read only memory cell being fabricated;
   forming a second layer of conductor adjacent the layer of interlevel insulator;
   etching the second layer of conductor, the layer of interlevel insulator and the first level gate conductor of each erasable read only memory cell being fabricated to define a floating gate/control gate stack; and
   forming first common source/drain regions of a second conductivity type opposite the first conductivity type in the first common source/drain areas and second source/drain regions of said second conductivity type in the second source/drain areas.

8. The method of claim 7 wherein the second source/drain region of each cell is formed as part of a source/drain region common to four cells being fabricated.

9. The method of claim 7 wherein each of the first level transistor gate conductors is formed adjacent the channel areas of at least two read only memory cells in each group of four cells.

10. The method of claim 7 wherein the second layer of conductor is etched to form a control gate conductor insulatively adjacent the floating gates of at least two erasable read only memory cells in each group of four cells.

11. The method of claim 10 wherein said step of forming a layer of conductor comprises the steps of depositing a layer of polycrystalline silicon and rendering the layer of polycrystalline silicon conductive.

12. The method of claim 10 wherein said step of forming insulator regions adjacent the exposed areas of the face of the layer of semiconductor comprises the step of growing thermal oxide.

13. The method of claim 12 wherein said step of growing thermal oxide includes the substep of performing an implant of dopants of the first conductivity type into the exposed areas.

14. The method of claim 10 wherein said step of forming a second layer of conductor comprises the step of forming a layer of polycrystalline silicon and rendering the layer of polycrystalline silicon conductive.

15. The method of claim 10 and further comprising the steps of:
   forming a second layer of interlevel insulator across the face of each cell being fabricated;
   patterning and etching the second layer of interlevel insulator to open contact holes to each first common source/drain region;
   patterning and etching the second layer of interlevel insulator to open contact holes to each second source/drain region; and
   forming connections to the source/drain regions of each cell being fabricated through the contact holes in the second layer of interlevel insulator.

16. A method for selectively fabricating an array of memory cells at a face of a layer of semiconductor of a first conductivity type comprising the steps of:
   selectively defining active areas on the face of the layer of semiconductor comprising the substeps of:
      masking the face of the layer of semiconductor;
      patterning and etching the mask to expose isolation areas on the layer of semiconductor spacing a plurality of active areas, the active areas including a plurality of source/drain areas with channel areas therebetween, a memory cell to be formed adjacent the channel area between a pair of source/drain areas, the channel area additionally exposed for each read only memory cell set to a logic zero being fabricated; and
      forming insulator regions adjacent the exposed areas;
   forming a layer of conductor insulatively adjacent the active areas;
   patterning and etching the layer of conductor to define a first level transistor gate conductor adjacent the channel area of each read only memory cell being fabricated, the first level gate conductor of each read only memory cell set to a logic zero disposed adjacent the insulator region formed adjacent the exposed area in the corresponding channel area;
   forming a layer of interlevel insulator adjacent the first level transistor gate conductor of each erasable read only memory cell being fabricated;
   forming a second layer of conductor adjacent the layer of interlevel insulator;
   etching the second layer of conductor, the layer of interlevel insulator and the first level transistor gate conductor of each erasable read only memory cell being fabricated to define a floating gate/control gate stack; and
   forming source/drain regions of a second conductivity type opposite the first conductivity type in the source/drain areas.

17. The method of claim 16 wherein the isolation areas are exposed to define a plurality of interconnected X-shaped active areas therebetween, each X-shaped active area including a common source/drain area for four cells and four arms, each arm including a channel area for a respective cell.

18. The method of claim 16 and further comprising the steps of:
   forming a second layer of interlevel insulator across the face of the array;
   patterning and etching the second layer of insulator to open contact holes to each source/drain region; and
   forming connections to the source/drain regions of each cell being fabricated through the contact holes in the second layer of interlevel insulator.

19. The method of claim 16 wherein the first conductivity type comprises p-type and the second conductivity type comprises n-type.

20. The method of claim 16 wherein the array is formed to include both erasable read only memory cells and read only memory cells.

21. A method for developing a production version of a programmed integrated circuit device, comprising the steps of:
   fabricating a development version of the integrated circuit with an array of erasable memory cells, said array of erasable memory cells formed by the substeps of:
      patterning and etching the mask to expose isolation areas on the layer of semiconductor spacing a plurality of active areas, the active areas including a plurality of source/drain areas with channel areas therebetween, each erasable memory cell including a pair of source/drain areas and a channel area;
      forming insulator regions adjacent the exposed areas;
      forming a layer of conductor insulatively adjacent the active areas;
      patterning and etching the layer of conductor to define a first level transistor gate conductor adjacent the channel area of each erasable memory cell;
      forming a layer of interlevel insulator adjacent the first level transistor gate conductor of each erasable memory cell;
      forming a second layer of conductor, the layer of interlevel insulator;
      etching the second layer of conductor, the layer of interlevel insulator and the first level transistor gate conductor of each erasable memory cell to define a floating gate/control gate stack; and
      etching the second layer of conductor, the layer of interlevel insulator and the first level transistor gate conductor of each erasable memory cell to define a floating gate/control gate stack; and
      forming source/drain regions of a second conductivity type opposite the first conductivity type in the source/drain areas; and
   fabricating a production version of the integrated circuit with a read only memory, said read only memory formed by the substeps of:
      masking the face of the layer of semiconductor;
      patterning and etching the mask to expose isolation areas on the layer of semiconductor spacing a plurality of active areas, the active areas including a plurality of source/drain areas with channel areas therebetween, each read only memory cell including a pair of source/drain areas and a channel area, the channel area additionally exposed for each read only memory cell set to a logic zero; and forming insulator regions adjacent the exposed areas;

forming a layer of conductor insulatively adjacent the active areas;

patterning and etching the layer of conductor to define a transistor gate conductor adjacent the channel area of each read only memory cell, the transistor gate conductor of each read only memory cell set to a logic zero disposed adjacent the insulator region formed adjacent the exposed area in the corresponding channel area; and forming source/drain regions of a second conductivity type opposite the first conductivity type in the source/drain areas.

22. The method of claim 21 in which the isolation areas are exposed to define a plurality of interconnected X-shaped active areas therebetween, each X-shaped active area including a common source/drain area for four memory cells and four arms, each arm including a channel area for a respective memory cell.

* * * * *